United States Patent [19]

Przybyszewski et al.

[11] Patent Number: 4,569,889

[45] Date of Patent: Feb. 11, 1986

[54] POLISHED OVERLAY COATINGS WITH ENHANCED DURABILITY

[75] Inventors: John S. Przybyszewski, Avon; Richard G. Claing, Manchester, both of Conn.

[73] Assignee: United Technologies Corporation, Hartford, Conn.

[21] Appl. No.: 665,846

[22] Filed: Oct. 29, 1984

[51] Int. Cl.[4] .............................................. B32B 15/00
[52] U.S. Cl. .................................... 428/612; 428/687; 204/129.35
[58] Field of Search .............................. 428/612, 687; 204/129.35

[56] References Cited

U.S. PATENT DOCUMENTS 4,321,310  3/1982  Ulion et al. ........................ 428/612
4,405,660  9/1983  Ulion et al. ...................... 427/248.1
4,414,249  11/1983  Ulion et al. ..................... 204/129.35

*Primary Examiner*—Veronica O'Keefe
*Attorney, Agent, or Firm*—Charles E. Sohl

[57] ABSTRACT

A method is described for improving the oxidation durability of overlay coatings. By polishing the surface to reduce the surface roughness to less than about 15 microinches AA the initial oxidation durability of the material, the point at which oxide spallation is first observed, can be increased from about 5 hours to about 200–300 hours.

3 Claims, No Drawings

POLISHED OVERLAY COATINGS WITH ENHANCED DURABILITY

DESCRIPTION

1. Technical Field

This invention relates to superalloy articles having protective overlay coatings. The oxidation durability of such coated articles can be increased according to the present invention by polishing the surface.

2. Background Art

Superalloys are materials, usually based on iron, nickel or cobalt, which have useful strength properties at temperatures in excess of about 1000° F. Usually, such alloys do not have adequate resistance to environmental degradation. For this reason superalloy articles are often given protective coatings.

The MCrAlY type of overlay coatings are well described in the prior art including the following U.S. Pat. Nos., which relate to variations on the MCrAlY type coatings: No. 3,528,861; No. 3,542,530; No. 3,649,225; No. 3,676,085; No. 3,754,903; No. 3,928,026; No. 3,918,139; No. 3,993,454; No. 4,034,142; and No. 4,419,416. These patents are incorporated herein by reference. Such articles derive their continued oxidation resistance by the formation of an oxide surface layer. The surface layer is comprised of an oxide (essentially $Al_2O_3$) through which oxygen does not readily diffuse. This oxygen diffusion limiting surface layer thereafter reduces or eliminates oxidation of the underlying coating material. According to many of the referenced patents, a preferred method for producing such coatings consists of a vapor deposition process followed by a grit blasting process to eliminate any surface defects and a moderately high temperature diffusion treatment to securely bond the coating to the substrate. The grit or glass bead peening process produces a surface finish which is typically 25–40 microinches AA.

U.S. Pat. Nos. 4,321,311 and 4,405,659 relate to thermal barrier coatings consisting of an initial MCrAlY layer having thereon a columnar ceramic coating material deposited by a vapor deposition process. U.S. Pat. Nos. 4,321,310 and 4,405,660 teach that by polishing the initial MCrAlY surface layer the subsequent durability of the ceramic overlayer can be substantially improved. There is no teaching that the polishing of the MCrAlY surface layer has any durability advantage in the life of the overlay coating absent a ceramic layer.

DISCLOSURE OF THE INVENTION

The invention relates to a method for improving the oxidation durability of overlay coatings, particularly overlay coatings, by polishing the surface of the overlay coating to produce a smooth surface finish with an average roughness of less than about 15 microinches AA.

The foregoing and other objects, features and advantages of the present invention will become more apparent from the following description of preferred embodiments.

BEST MODE FOR CARRYING OUT THE INVENTION

Overlay coatings to which the present process may be applied include those based on iron, nickel or cobalt or mixtures thereof. These coatings include, but are not limited to, the MCrAl coatings where chromium ranges from about 15 to about 45% and aluminum ranges from about 7 to about 15%; the MCrAlY coatings where chromium ranges from about 15 to about 45%, aluminum ranges from about 7 to about 20% and yttrium ranges from about 0.1 to about 5%; and the MCrAlHf coatings where chromium ranges from about 15 to about 45%, aluminum ranges from about 7 to about 15% and hafnium ranges from about 0.5 to about 7%. In all of these coatings "M" is selected from the group consisting of nickel, cobalt, iron and mixtures thereof with mixtures of nickel and cobalt being particularly favored. The yttrium (where present) may be partly or wholly replaced by lanthanum, cerium, Misch metal and mixtures thereof. Additionally, up to 10% of a material selected from the group consisting of platinum, rhenium, silicon, tantalum and manganese may be added to any of these coatings. Regardless of the exact coating composition or the incidental alloying elements which may be added, these coatings have the common characteristic that they resist oxidation by forming an oxide layer based on alumina which is resistant to the subsequent inward diffusion of oxygen. The long term durability of such coatings is substantially affected by the adherence of the oxide layer and a common failure mechanism is the spallation of the oxide layer, especially during repeated thermal cycling. Each time the oxide layer spalls off it reforms on the surface of the coating. However, the repetitive reforming of the coating depletes the surface of the coating in the elements which act to form the coating, particularly aluminum. At some point in this process, the aluminum content of the coating will drop to a point at which the oxide coating which forms will not be alumina based and will not adequately resist the diffusion of oxygen. At this point the oxidation rate becomes castatrophic and the coating is considered to have failed. Many of the alloying elements added to the basic overlay materials are added for the purpose of enhancing the oxide adherence and yttrium found in the basic MCrAlY composition is believed to contribute materially to this oxide retention.

According to the present invention it has been found that the initial time to spallation of the oxide coating can be substantially increased if the original coating has its surface polished prior to exposure to high temperature oxidizing conditions. The provision of a polished surface layer can increase the time to initial oxide spallation of from about 5–10 hours to about 200–300 hours.

The surface polishing may be accomplished by any technique which achieves the desired surface finish. An easily employed technique involves mechanical abrasion or mechanical polishing using an abrasive media. For example, we have successfully used a rotating cloth wheel charged with an abrasive which is typically $Al_2O_3$.

The mechanical polishing technique is one which is known to produce favorable results. However, we are not aware of any reason why any other polishing technique producing the desired surface finish qualities would not also produce the same beneficial effect. In particular, it is known to polish metal surfaces using a chemical and electrochemical techniques and it is anticipated that any such process would produce the desired results provided of course that the polishing technique did not change the surface chemistry of the MCrAlY coating.

In one evaluation a gas turbine blade having a substrate with a nominal composition of 9% Cr, 10% Co, 12% W, 2% Ti, 5%Al, 0.015% B, 2% Hf, balance Ni was coated with an MCrAlY coating material whose nominal composition was 18% Cr, 12% Al, 0.5% Y, balance Ni. Two blades were so coated; one was polished using the mechanical process described above to produce a surface finish on the order of 10-15 microinches AA while the other was left in the glass bead peened condition and had a surface finish on the order of 25-35 microinches AA. AA stands for arithmetic average and refers to the mathematical apparatus used to reduce multiple surface finish values to a single value. These turbine blades were then engine tested and it was observed that the nonpolished blade exhibited signs of oxide spallation after 5-6 hours of engine testing while the polished blade did not exhibit any spallation after about 270 hours of testing. Accordingly, it can be seen that the present invention offers substantial advantages in the initial oxidation behavior of overlay coated gas turbine components.

Although this invention has been shown and described with respect to a preferred embodiment, it will be understood by those skilled in this art that various changes in form and detail thereof may be made without departing from the spirit and scope of the claimed invention.

We claim:

1. A method for improving the oxidation durability of an MCrAlY overlay coated superalloy component at elevated temperatures which comprises:
    polishing the gas contacting surface of the coating to produce a surface roughness of less than about 15 microinches AA.

2. A method as in claim 1 in which the polishing technique involves mechanical abrasion.

3. A gas turbine engine superalloy component having an MCrAlY overlay protective coating, said coating having an outer, gas contacting surface having a coating with a surface roughness of less than about 15 microinches AA.

* * * * *